(12) United States Patent
Fujii

(10) Patent No.: US 7,723,975 B2
(45) Date of Patent: May 25, 2010

(54) CURRENT DETECTING CIRCUIT

(75) Inventor: Norio Fujii, Kyoto (JP)

(73) Assignee: Rohm Co., Ltd. (JP)

( * ) Notice: Subject to any disclaimer, the term of this patent is extended or adjusted under 35 U.S.C. 154(b) by 280 days.

(21) Appl. No.: 11/795,419

(22) PCT Filed: Jan. 16, 2006

(86) PCT No.: PCT/JP2006/300444

§ 371 (c)(1),
(2), (4) Date: Jul. 17, 2007

(87) PCT Pub. No.: WO2006/075739

PCT Pub. Date: Jul. 20, 2006

(65) Prior Publication Data

US 2009/0153131 A1 Jun. 18, 2009

(30) Foreign Application Priority Data

Jan. 17, 2005 (JP) .............................. 2005-009654

(51) Int. Cl.
*G01R 19/00* (2006.01)
*G01R 31/08* (2006.01)
(52) U.S. Cl. .................... 324/76.11; 324/522
(58) Field of Classification Search ................. 324/522, 324/76.11
See application file for complete search history.

(56) References Cited

U.S. PATENT DOCUMENTS 5,585,701 A * 12/1996 Kaida et al. ............ 318/400.27
5,656,897 A * 8/1997 Carobolante et al. ... 318/400.36
7,034,542 B2 * 4/2006 Peterson ..................... 324/522
2005/0018340 A1 * 1/2005 Tanner ........................ 360/69

FOREIGN PATENT DOCUMENTS

| JP | 61-184466 | 8/1986 |
| JP | 5-196660 | 8/1993 |
| JP | 5-232150 | 9/1993 |
| JP | 7-5225 | 1/1995 |
| JP | 7-113826 | 5/1995 |
| JP | 2001-264365 | 9/2001 |

OTHER PUBLICATIONS

International Search Report for International Application No. PCT/JP2006/300444 mailed Apr. 25, 2006.
International Preliminary Report on Patentability for International Application No. PCT/JP2006/300444 mailed Jul. 17, 2007.
Chinese Office Action for Chinese Application No. 200680001428.1 issued Apr. 3, 2009 with English translation.

* cited by examiner

*Primary Examiner*—Amy He
(74) *Attorney, Agent, or Firm*—Cantor Colburn LLP

(57) ABSTRACT

Indirect detection of current using a current mirror circuit is performed with good accuracy, with a small sized circuit. In a current detection circuit, a current detection current mirror circuit includes an output current transistor which supplies an output current, and a current detection transistor which supplies a detection current proportional to the output current. A compensation current mirror circuit is connected to a current supply side of the current detection current mirror circuit, so as to make a collector voltage of the output current transistor and a collector voltage of the current detection transistor equal. A current detector detects the detection current, to indirectly detect the output current.

15 Claims, 2 Drawing Sheets

CURRENT DETECTING CIRCUIT

CROSS REFERENCE TO RELATED APPLICATIONS

This is a U.S. national stage of application No. PCT/JP2006/300444, filed on 16 Jan. 2006. Priority under 35 U.S.C. 119(a) and 35 U.S.C. 365(b) is claimed from Japanese Application No. 2005-009654, filed 17 Jan. 2005, the disclosures of which are also incorporated herein by reference.

BACKGROUND OF THE INVENTION

1. Field of the Invention

The present invention relates to a current detection circuit which uses a current mirror circuit to indirectly detect a current.

2. Description of the Related Art

Current detection circuits are used in various applications such as motor drivers, power supplies, and the like. In a current detection circuit, in general, a resistor is inserted in a current supply path to a load, and current is directly detected from the two end-voltages thereof, but a method of indirect detection using a current mirror circuit is also being attempted. FIG. 1 of Patent Document 1 discloses a current mirror circuit 1 formed of transistors 3 and 2. When a size ratio of the transistors 3 and 2 is n:1, current flowing in the transistors 3 and 2 also has a ratio of n:1. When a predetermined voltage is given to a control terminal 4, the transistor 3 supplies a current IL1 to a load 13, and the transistor 2 supplies a detection current IS1=IL1÷n to a resistor 11 via a transistor 9. Consequently, if the resistance value of the resistor 11 is R, a detection voltage R×IS1=R×IL1÷n is outputted at a detection terminal 12.

As described in Patent Document 2, this type of circuit can detect a load current with good accuracy and with no loss, without interposing a sense resistor in a load current path, and when detecting the load current, it is possible to easily switch gain in accordance with the size of the load current.

Patent Document 1: Japanese Patent Application, Laid-Open No. 2001-264365
Patent Document 2: Japanese Patent Application, Laid Open No. H7-113826

In FIG. 1 of the abovementioned Patent Document 1, with the transistors 3 and 2, which make up the current mirror circuit 1, in an unsaturated state, a current IDS between source-drain terminals has a dependency with a voltage VDS across the source-drain terminals. Consequently, a feedback circuit 5 formed of an operational amplifier 6 and a transistor 7 performs control so that voltages VDS across the source-drain terminals of the transistors 3 and 2 become equal.

However, since capacity for phase compensation is necessary inside the operational amplifier 6 included in the feedback circuit 5, when this type of feedback circuit is provided, the circuit size becomes large.

SUMMARY OF THE INVENTION

The present invention has been made in light of these conditions, and a general purpose thereof is the provision of a current detection circuit which, when indirectly detecting current using a current mirror circuit, can perform with good accuracy with a small sized circuit.

A current detection circuit in an embodiment of the present invention comprises: a current detection current mirror circuit including an output current transistor which supplies an output current, and a current detection transistor which supplies a detection current proportional to the output current; a compensation current mirror circuit which is connected to a current supply side of the current detection current mirror circuit, so that a terminal voltage of the output current transistor and a terminal voltage of the current detection transistor have a predetermined relationship; and a current detector which indirectly detects the output current by detecting the detection current. The "predetermined relationship" may be a relationship in which the terminal voltage of the output current transistor and the terminal voltage of the current detection transistor are equal.

According to this embodiment, by connecting the compensation current mirror circuit to the current detection current mirror circuit, it is possible to raise accuracy, with a small sized circuit, of potential of an electrode, such as, for example, a collector electrode or a drain electrode, of the output current transistor and the current detection transistor.

The current detection current mirror circuit may further include an input current transistor in order to generate, in the output current transistor, output current proportional to an input current from outside, and an input current supply current mirror circuit may also be provided, including a first input current supply transistor which receives the input current, a second input current supply transistor, connected to the input current transistor, which generates a current corresponding to the input current in the input current transistor, and a third input current supply transistor which supplies a bias current to the compensation current mirror circuit.

According to this embodiment, by supplying the bias current coupled with the input current, to the compensation current mirror, it is possible to adjust potential of electrodes, such as, for example, the collector electrode or the drain electrode, of the output current transistor and the current detection transistor, according to the input current.

The compensation current mirror circuit may include a first compensation transistor which is connected to the current detection transistor and which supplies, as the detection current, a current proportional to the bias current; and a second compensation transistor which is connected to the output current transistor and which receives the bias current at an opposite electrode thereof.

According to this embodiment, by making the output current of the first compensation transistor the detection current, it is possible to realize a detection current in which an effect of deviation in mirror ratio on the current detection current mirror circuit is reduced.

A ratio of current drive capability of the input current transistor and the current detection transistor, a ratio of current drive capability of the second compensation transistor and the first compensation transistor, and a ratio of current drive capability of the second input current supply transistor and the third input current supply transistor may be made to be corresponding, and the current drive capability of the second compensation transistor may be different to that of the input current transistor.

According to this embodiment, by adjusting the current drive capability of the second compensation transistor, within the collector current or the drain current of the output current transistor, a portion, flowing in the second compensation transistor, that does not become an output current Io, can be reduced, and it is possible to raise detection accuracy.

At least the current detection current mirror circuit and the compensation current mirror circuit may be integrated on one semiconductor substrate. The integration may also include a current detector and the integration may additionally include the input current supply current mirror circuit.

A motor apparatus of another embodiment of the present invention is provided with a motor, the current detection circuit of the above-described embodiment, and a motor drive circuit which drives the motor, referring to a current detected by the current detection circuit.

An electronic device of another embodiment of the present invention is provided with a recording disk, and the motor apparatus of the above described embodiment, which controls rotation of the recording disk.

In addition, arbitrary combinations of the above mentioned component elements, and changes of the representation of the present invention among devices, methods, systems, and the like, are also valid embodiments of the present invention.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 2 is preferably used.

DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

A first embodiment illustrates a current detection circuit which detects current indirectly, using a current mirror circuit that uses a bipolar transistor. Furthermore, a configuration is illustrated in which collector potential between transistors that make up the current mirror circuit is kept the same as far as possible.

Figure 1:
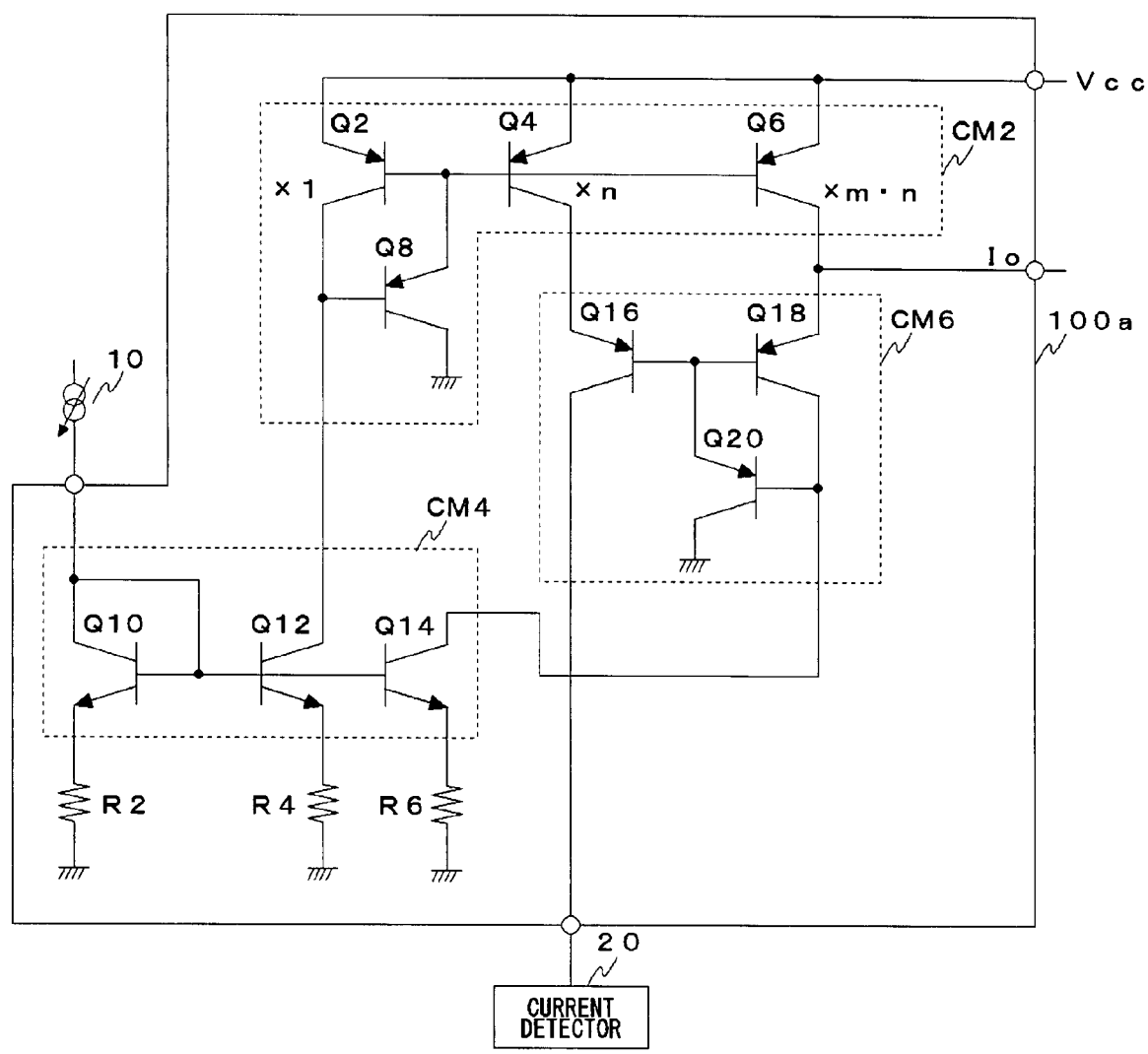
FIG. 1 shows a configuration of a current detection circuit according to a first embodiment.

FIG. 1 shows a configuration of the current detection circuit 100a of the first embodiment. With this current detection circuit 100a, an explanation is given of an example using a PNP bipolar transistor. An input current transistor Q2, a current detection transistor Q4, and an output current transistor Q6 make up the first current detection current mirror circuit CM2. Emitter electrodes of the input current transistor Q2, the current detection transistor Q4, and the output current transistor Q6 are connected to a high potential side reference potential Vcc, such as a power supply voltage, or the like. Base electrodes thereof are wire-connected to each other, and a current path thereof is connected to a current path of a collector side of the input current transistor Q2, via a first base current compensation transistor Q8.

A collector current IC of a bipolar transistor is given by Equation 1 as follows.

$$IC = (qDn/WB)nP \cdot \exp(qVBE/kT) \quad \text{(Equation 1)}$$

Here, q represents charge, Dn represents electronic diffusion coefficient, WB represents base width, nP represents donor concentration, VBE represents inter base-emitter voltage, k represents Boltzmann coefficient, and T represents absolute temperature.

Base current IB of the bipolar transistor is given by Equation 2 as follows.

$$IB = (qDq/Lp)pN\{\exp(qVBE/kT) - 1\} \quad \text{(Equation 2)}$$

Here, Dq represents hole diffusion coefficient, Lp represents hole diffusion length, and pN represents base acceptor concentration.

Accordingly, a current amplification factor hFE of the bipolar transistor is given by Equation 3 as follows.

$$hFE = (qDn/WB)nP \cdot \exp(-qVBE/kT)/(qDn/WB)pN\{\exp(qVBE/kT) - 1\} = (Dn/Dp)(nP/pN)(Lp/WB) \quad \text{(Equation 3)}$$

As may be understood from Equation 3 described above, the current amplification factor hFE of the bipolar transistor is determined by transistor structure. For example, if the base width WB is halved, the current amplification factor hFE can be doubled.

In the present embodiment, the input current transistor Q2, the current detection transistor Q4, and the output current transistor Q6 have different structures. Consequently, the current amplification factors hFE of each of the transistors Q2, Q4, and Q6, that is the current drive capabilities, are set to be different. In the present embodiment, a ratio of the current drive capabilities thereof, from the input current transistor Q2, in order, is set as 1:n:mn. Accordingly, in the first current detection current mirror circuit CM2, in order that the voltage across the base emitters is equal, a collector current flows in accordance with current drive capability. Specifically, a collector current of 1:n:mn, in order, from the input current transistor Q2 is flowing.

An emitter electrode of a first base current compensation transistor Q8 is commonly connected to base electrodes of the three transistors Q2, Q4, and Q6, and that make up the first current detection current mirror circuit CM2; the base electrodes are connected to a current path on a collector side of the input current transistor Q2; and the emitter electrodes are connected to a low potential side reference potential, such as a ground potential or the like. The first base current compensation transistor Q8 uses its current drive capability to act to reduce current flowing into a current path on the collector side of the input current transistor Q2. In this way, accuracy is improved for a mirror ratio of current flowing in a current path on the collector side of the input current transistor Q2, and current flowing in a current path on a collector side of the output current transistor Q6.

In the present embodiment, supply of an input current to the current detection circuit 100a is carried out by an input current supply current mirror circuit CM4 that includes a first input current supply transistor Q10, a second input current supply transistor Q12, and a third input current supply transistor Q14. Input current from outside is represented in FIG. 1 by a symbol of a variable current source 10. The first input current supply transistor Q10, the second input current supply transistor Q12, and the third input current supply transistor Q14 have an NPN configuration, and use a similar structure.

An emitter electrode of the first input current supply transistor Q10 is grounded via a first resistor R2; a base electrode thereof is commonly connected to base electrodes of the transistors Q12 and Q14 making up an input current supply current mirror circuit CM4; and collector electrodes thereof receive input current from outside. Furthermore, in order to configure the input current supply current mirror circuit CM4, a current path on a collector side of the first input current supply transistor Q10, and a current path in which base electrodes of the transistors Q10, Q12, and Q14, that make up the input current supply current mirror circuit CM4, are connected. In addition, similar to the first base current compensation transistor Q8, a transistor maybe inserted therebetween.

An emitter electrode of the second input current supply transistor Q12 is grounded via a second resistor R4, and a collector electrode thereof is connected to a collector electrode of the input current transistor Q2. An emitter electrode of the third input current supply transistor Q14 is grounded via a third resistor R6, and a collector electrode thereof is connected to a collector electrode of a second collector potential compensation transistor Q18, described later.

Consequently, a current equal or approximately equal to an input current from outside flows in a current path on a collector side of the input current transistor Q2, and at the same time, flows as a bias current in a current path on a collector side of the second collector potential compensation transistor Q18, described later.

A first collector potential compensation transistor Q16 and a second collector potential compensation transistor Q18 make up a first compensation mirror circuit CM6. The ratio of current drive capabilities thereof is set at n:1. This ratio corresponds to a ratio of current drive capabilities of the first current detection current mirror circuit CM2; the first collector potential compensation transistor Q16 and the current detection transistor Q4 are set to a same current drive capability; and the second collector potential compensation transistor Q18 and the input current transistor Q2 are also set to a same current drive capability.

An emitter electrode of the first collector potential compensation transistor Q16 is connected to a collector electrode of the current detection transistor Q4, and the collector electrodes thereof are connected to a current detector 20, described later. The emitter electrode of the second collector potential compensation transistor Q18 is connected to a collector electrode of the output current transistor QG, and the collector electrode thereof is connected to a collector electrode of the third input current supply transistor Q14.

Furthermore, in order to configure the first compensation current mirror circuit CM6, base electrodes of the first collector potential compensation transistor Q16 and the second collector potential compensation transistor Q18 are wire-connected; and a current path thereof and a current path on the collector side of the second collector potential compensation transistor Q18 are connected via a second base current compensation transistor Q20. The second base current compensation transistor Q20 functions similarly to the first base current compensation transistor Q8.

In the current detection circuit 100a of the present embodiment, an output current path branches from a current path connecting the collector electrode of the output current transistor Q6 and the emitter electrode of the second collector potential compensation transistor Q18; and, from this current path, a collector current of the output current transistor Q6 is outputted to the outside, as an output current Io. A little of this collector current also flows in the emitter electrode of the second collector potential compensation transistor Q18, but is of a level that can be ignored. This output current Io has a value for which the input current is amplified, corresponding to a ratio of the current drive capabilities of the input current transistor Q2 and the output current transistor Q6. In the present embodiment, by detecting the collector current of the first collector potential compensation transistor Q16, but not by directly detecting this output current Io, the output current Io is indirectly detected, and compensation is done for the collector potential of the current detection transistor Q4 and the output current transistor Q6.

The current drive capability of the current detection transistor Q4 is set at 1/M times the current drive capability of the output current transistor Q6. For example, this may be set at 1/1000. Consequently, the collector current of the current detection transistor Q4 has a value 1/M times the output current Io and n times the input current.

Furthermore, in the present embodiment, the current drive capabilities of the second input current supply transistor Q12, the third input current supply transistor Q14, the input current transistor Q2, and the second collector potential compensation transistor Q18, are set to be the same; and the current drive capabilities of the first base current compensation transistor Q8 and the second base current compensation transistor Q20 are set to be the same; and since the ratio of the current drive capabilities of the first collector potential compensation transistor Q16 and the second collector potential compensation transistor Q18 is set to n:1, the collector current of the first collector potential compensation transistor Q16 has a value n times the input current, and, at the same time, is 1/M times the output current Io.

The current detector 20 detects the collector current of the first collector potential compensation transistor Q16. For example, a sense resistor, not shown in the figures, may be inserted between ground and a collector electrode thereof, and voltage on the collector electrode side of this sense resistor may be detected, to detect the collector current. By amplifying this current corresponding to a ratio of the current drive capabilities of the current detection transistor Q4 and the output current transistor Q6, it is possible to indirectly detect the output current Io of a location where detection is to be carried out. With this type of detection method, it is possible to curtail voltage losses, in comparison to a method in which the output current Io is directly detected.

Since the first collector potential compensation transistor Q16 and the second collector potential compensation transistor Q18 make up the first compensation current mirror circuit CM6, a current corresponding to a ratio of the drive capabilities thereof flows in both transistors Q16 and Q18, and since the base voltages become equal, the emitter voltages also become equal. In this way, when variations occur in potential of the two collector electrodes of the current detection transistor Q4 and the output current transistor Q6, compensation is done so that the potential of the two collector electrodes becomes equal. For example, when the output current transistor Q6 transits to a linear region, a deviation occurs in a mirror ratio with the current detection transistor Q4, but by connecting to the first compensation current mirror circuit CM6, compensation is done so that the potential of the collector electrodes becomes equal.

According to the present embodiment as explained above, also in cases in which the output current Io changes, since the two inter base emitter voltages of the first collector potential compensation transistor Q16 and the second collector potential compensation transistor Q18 are equal, compensation is done so that the potential of the two collector electrodes of the current detection transistor Q4 and the output current transistor Q6 become equal. Consequently, it is possible to perform current detection with good accuracy. On such occasions, since a differential amplifier circuit is not used, the number of circuit components can be reduced, and it is possible to simplify the overall circuit. In particular, when the present current detection circuit is formed as a monosilic IC, since differential amplifier circuit capacity can be saved, it is possible to make chip size quite small. Consequently, it is possible to detect current with good accuracy, with a small sized circuit.

Second Embodiment

The second embodiment illustrates a current detection circuit which detects current indirectly, using a current mirror circuit that uses a FET (field-effect transistor). Furthermore, a configuration is illustrated in which drain potential between FETs that make up the current mirror circuit is kept the same as far as possible.

Figure 2:
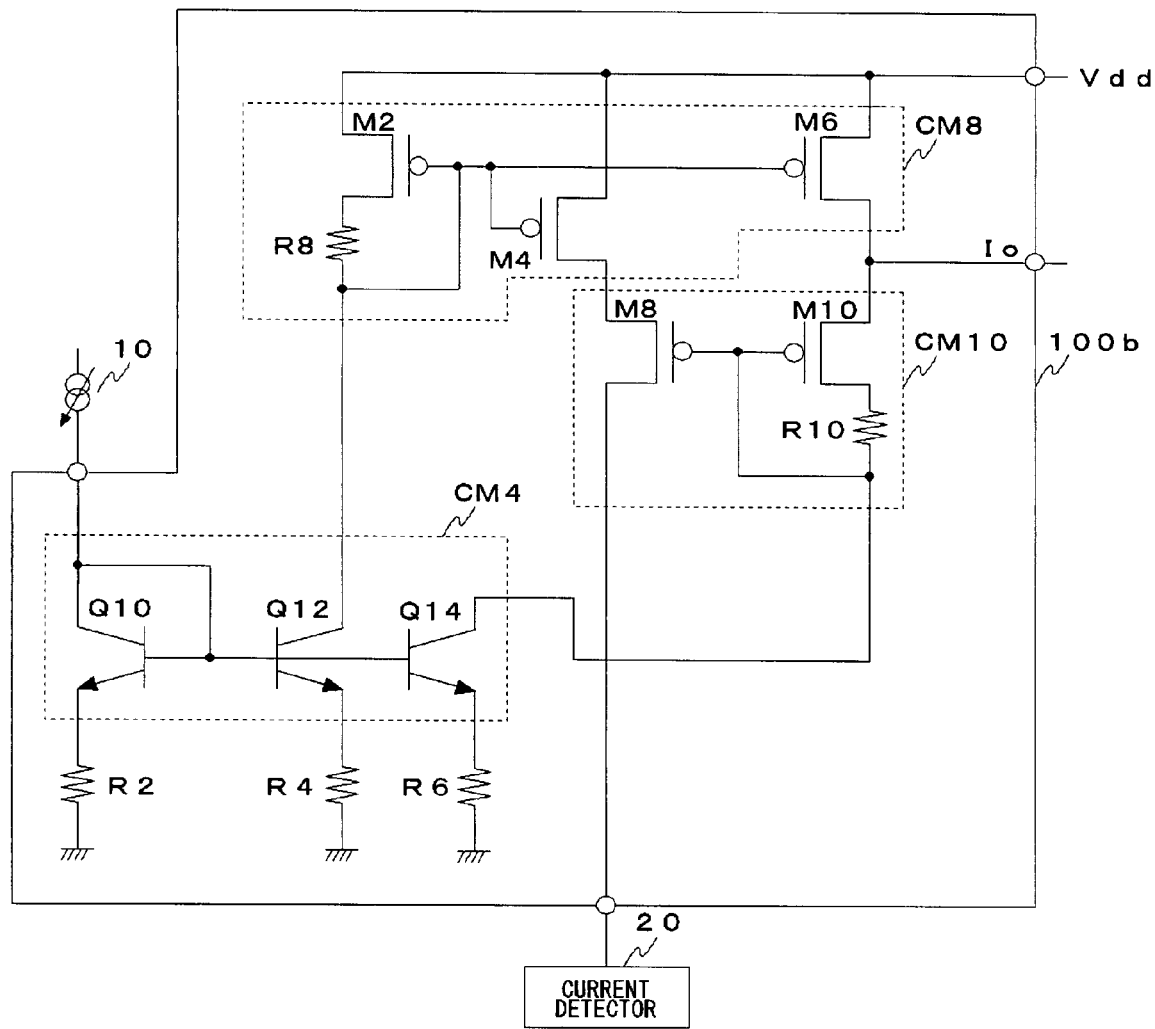
FIG. 2 shows a configuration of the current detection circuit according to a second embodiment.

FIG. 2 shows a configuration of the current detection circuit 100b according to the second embodiment. With this current detection circuit 100b, an explanation is given of an example using a P-channel MOSFET (metal oxide semiconductor FET). An input current FET (M2), a current detection FET (M4), and an output current FET (M6) make up a second current detection current mirror circuit CM8. Source electrodes of the input current FET (M2), the current detection FET (M4), and the output current FET (M6) are connected to a high potential side reference potential Vdd, such as a power supply voltage, or the like. Gate electrodes thereof are wire-connected, and are connected to a current path of a drain side of the input current FET (M2). A fourth resistor R8 is inserted between a connection point of these current paths and a drain electrode of the input current FET (M2).

A drain-source current IDS of the FET is given by Equation 4 as follows.

$$IDS = uC(W/L)\{(VGS-VT)VDS-VDS^2/2\}\} \quad \text{Equation 4}$$

Here, u represents hole mobility, C represents capacity of a gate oxide film, W represents channel width, L. represents channel length, VGS represents gate-source voltage, VT represents threshold voltage, and VDS represents source-drain voltage.

As will be understood from Equation 4 described above, the drain-source current IDS of the FET has a proportional relationship with the structure thereof, for example channel size (W/L). For example, if the channel width W is doubled, the drain-source current IDS can also be doubled.

In the present embodiment, a ratio of the current drive capabilities determined by each structure of the above-mentioned three FETs (M2, M4, and M6), is set to 1:n:mn, in order, from the input current FET (M2). In the second current detection current mirror circuit CM8, since the gate-source voltages are equal, a drain-source current corresponding to the current drive capability flows.

In the present embodiment, supply of the input current to the current detection circuit 100b is similar to that of the first embodiment and so an explanation is omitted.

A first drain potential compensation FET (M8) and a second drain potential compensation FET (M10) make up a second compensation current mirror circuit CM10. The ratio of the current drive capabilities thereof is set at n:1. This ratio corresponds to a ratio of the current drive capabilities of the second current detection current mirror circuit CM8; the first drain potential compensation FET (M8) and the current detection FET (M4) are set to a same current drive capability; and the second drain potential compensation FET (M1) and the input current FET (M2) are also set to a same current drive capability.

A source electrode of the first drain potential compensation FET (M8) is connected to a drain electrode of the current detection FET (M4), and this drain electrode is connected to the current detector 20, similar to the first embodiment. A source electrode of the second drain potential compensation FET (M10) is connected to a drain electrode of an output current FET (M6), and this drain electrode is connected to a collector electrode of a third input current supply transistor Q14.

Furthermore, in order to configure the second compensation current mirror circuit CM10, gate electrodes of the first drain potential compensation FET (M8) and the second drain potential compensation FET (M10) are wire-connected, and are connected to a current path on a drain side of the second drain potential compensation FET (M10). Between a connection point with the current path thereof and a drain electrode of the second drain potential compensation FET (M10), a fifth resister R10 is inserted.

In the current detection circuit of the present embodiment, an output current path branches from a current path connecting a drain electrode of the output current FET (M6) and a drain electrode of the second drain potential compensation FET (M10), and from this current path, a drain current of the output current FET (M6) is outputted to the outside, as an output current Io. This output current Io has a value for which the input current is amplified, corresponding to a ratio of the current drive capabilities of the input current FET (M2) and the output current FET (M6). In the present embodiment, by detecting the drain current of the first drain potential compensation FET (M8), and not by directly detecting this output current Io, the output current Io is indirectly detected.

Since the first drain potential compensation FET (M8) and the second drain potential compensation FET (M10) make up the second compensation current mirror circuit CM10, a current corresponding to a ratio of the drive capabilities thereof flows, and since gate voltages become equal, source voltages also become equal. In this way, when variations occur in potential of the two drain electrodes of the current detection FET (M4) and the output current FET (M6), compensation is done so that the potential of the two drain electrodes becomes equal. For example, when the output current FET (M6) is saturated, a deviation occurs in a mirror ratio with the current detection FET (M4), but by connecting the second compensation current mirror circuit, compensation is done so that the potential of the drain electrodes becomes equal.

According to the present embodiment as explained above, also in cases in which the output current Io changes, since the two gate-source voltages of the first drain potential compensation FET (M8) and the second drain potential compensation FET (M10) are equal, compensation is done so that the potential of the two drain electrodes of the current detection FET (M4) and the output current FET (M6) becomes equal. Consequently, effects similar to those of the first embodiment are realized. Furthermore, in the second embodiment, normal operation is possible even when the output voltage is a comparatively low voltage, for example, 1 volt.

Figure 3:
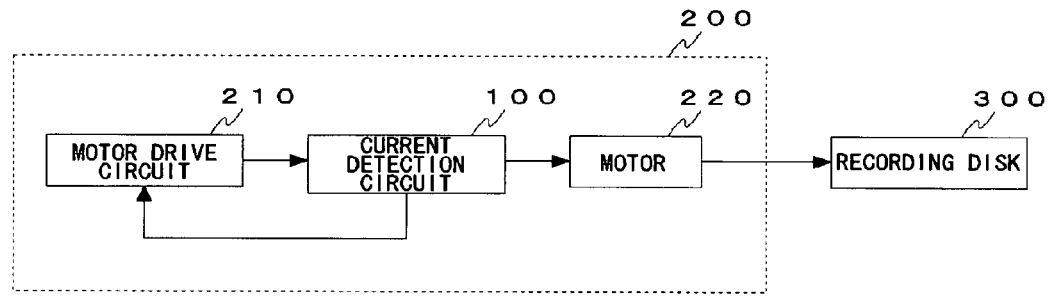
FIG. 3 shows a configuration of an electronic device in which the current detection circuit of FIG. 1

FIG. 3 is a circuit diagram showing a configuration of an electronic device 1000 in which the current detection circuit 100, according to the above described embodiment, is preferably used. This electronic device 1000 is provided with a motor apparatus 200 and a recording disk 300. The electronic device 1000 is a laptop or desktop personal computer, a DVD player, a game machine, or the like, and the recording disk 300 is a hard disk, a DVD disk, or the like. The motor apparatus 200 controls rotation of the recording disk 300. The motor apparatus 200 includes a motor drive circuit 210, a current detection circuit 100, and a motor 220. The motor drive circuit 210 drives the motor 220 via the current detection circuit 100. At this time, reference is made to a detection current of the current detection circuit 100, to control current that is to be supplied to the motor 220. For example, control is carried out so that overcurrent is not supplied to the motor 220, and control is appropriately performed so that a constant current is supplied to the motor 220. As described above, it is possible to realize a motor apparatus of a small size with high accuracy, and an electrical device in which the motor is installed.

The present invention has been explained based on the embodiments above. The embodiments are examples; various modified examples in combinations of various component elements and various processes thereof are possible, and a person skilled in the art will understand that such modified examples are within the scope of the present invention.

In the first embodiment, the ratio of the current drive capabilities of the current detection transistor Q4 and the first collector potential compensation transistor Q16 need not be in an equal ratio but may be set at n:kn; the ratio of the current drive capabilities of the input current supply transistor Q2 and the second collector potential compensation transistor Q18 may be set to 1:k; and the collector current of the first collector potential compensation transistor Q16 can have a value kn times the input current, and k/M times the output current Io. By setting this k to be less than 1, it is possible to reduce reactive current that does not contribute to the output current Io, within the collector current of the output current transistor Q6, a little of which flows in the second collector potential compensation transistor Q18. The current detector 20 can detect current in a desired range. Furthermore, at this occasion, it is necessary to set the ratio of the current drive capabilities of the first base current compensation transistor Q8 and the second base current compensation transistor Q20, and a similar ratio for the second input current supply transistor Q12 and the third input current supply transistor Q14, to be 1:k. Furthermore, also in the second embodiment, if the current drive capabilities of circuit elements corresponding to the first embodiment are set as described above, and a ratio of resistance values of the fourth resistor R8 and the fifth resistor R10 is set at k:1, a similar relationship holds true.

Furthermore, the current detector 20 may detect a current flowing from the collector electrode of the current detection transistor Q4, or the drain electrode of the current detection FET (M4).

Furthermore, the current mirror circuits shown in the first and second embodiments are not limited to the above described types, and various types of circuit, such as a Wilson-type or the like, may be used. In addition, there is no limitation to the transistors used in the above described embodiments, and other transistors may be used, such as an NPN bipolar transistor, a P-channel MOSFET, or the like. Moreover, in the second embodiment, the fourth resistor R8 and the fifth resistor R10 need not be inserted.

Furthermore, when the present current detection circuit is a monosilic IC, the input current transistor Q2, the current detection transistor Q4, and the output current transistor Q6 may be designed to be in pairs, in a layout. The first collector potential compensation transistor Q16 and the second collector potential compensation transistor Q18 may similarly be designed to be in pairs. Moreover, corresponding FETs in the second embodiment may also be designed in the same way.

While the preferred embodiments of the present invention have been described using specific terms, such description is for illustrative purposes only, and it is to be understood that changes and variations may be made without departing from the spirit or scope of the appended claims.

The invention claimed is:

1. A current detection circuit comprising:
   a current detection current mirror circuit comprising an output current transistor which supplies an output current, and a current detection transistor which supplies a detection current proportional to the output current;
   a compensation current mirror circuit which is connected to a current supply side of the current detection current mirror circuit, so that a terminal voltage of the output current transistor and a terminal voltage of the current detection transistor have a predetermined relationship; and
   a current detector which indirectly detects the output current, by detecting the detection current
   wherein the current detection current mirror circuit further comprises an input current transistor for generating, in the output current transistor, the output current proportional to an input current from outside; and
   the current detection circuit further comprises an input current supply current mirror circuit comprising:
      a first input current supply transistor which receives the input current;
      a second input current supply transistor, connected to the input current transistor, which generates a current corresponding to the input current in the input current transistor; and
      a third input current supply transistor which supplies a bias current to the compensation current mirror circuit.

2. A current detection circuit according to claim 1, wherein the compensation current mirror circuit comprises:
   a first compensation transistor which is connected to the current detection transistor and which supplies, as the detection current, a current proportional to the bias current; and
   a second compensation transistor which is connected to the output current transistor and which receives the bias current at an opposite electrode thereof.

3. A current detection circuit according to claim 2 wherein:
   a ratio of current drive capability of the input current transistor and the current detection transistor, a ratio of current drive capability of the second compensation transistor and the first compensation transistor, and a ratio of current drive capability of the second input current supply transistor and the third input current supply transistor are made to be corresponding, and
   the current drive capability of the second compensation transistor is different to that of the input current transistor.

4. A current detection circuit according to claim 3, wherein at least the current detection current mirror circuit and the compensation current mirror circuit are integrated on one semiconductor substrate.

5. A current detection circuit according to claim 2, wherein at least the current detection current mirror circuit and the compensation current mirror circuit are integrated on one semiconductor substrate.

6. A current detection circuit according to claim 1, wherein at least the current detection current mirror circuit and the compensation current mirror circuit are integrated on one semiconductor substrate.

7. A current detection circuit according to claim 1, wherein at least the current detection current mirror circuit and the compensation current mirror circuit are integrated on one semiconductor substrate.

8. A motor apparatus comprising:
   a motor;
   a current detection circuit according to claim 1; and
   a motor drive circuit which drives the motor, referring to a current detected by the current detection circuit.

9. An electronic device comprising:
   a recording disk; and the motor apparatus according to claim 8, which controls rotation of the recording disk.

10. A motor apparatus comprising:
a motor;
a current detection circuit according to claim 2; and
a motor drive circuit which drives the motor, referring to a current detected by the current detection circuit.

11. An electronic device comprising:
a recording disk; and
the motor apparatus according to claim 10, which controls rotation of the recording disk.

12. A motor apparatus comprising:
a motor;
a current detection circuit according to claim 3; and
a motor drive circuit which drives the motor, referring to a current detected by the current detection circuit.

13. An electronic device comprising:
a recording disk; and
the motor apparatus according to claim 12, which controls rotation of the recording disk.

14. A motor apparatus comprising:
a motor;
a current detection circuit according to claim 6; and
a motor drive circuit which drives the motor, referring to a current detected by the current detection circuit.

15. An electronic device comprising:
a recording disk; and
the motor apparatus according to claim 14, which controls rotation of the recording disk.

* * * * *